US012726208B1

(12) United States Patent
Farjadrad et al.

(10) Patent No.: US 12,726,208 B1
(45) Date of Patent: Sep. 1, 2026

(54) EFFICIENT CLOCKING SCHEME FOR DIE-TO-DIE CONNECTIVITY

(71) Applicant: Eliyan Corporation, Santa Clara, CA (US)

(72) Inventors: Ramin Farjadrad, Los Altos, CA (US); Nhan Nguyen, Lake Oswego, OR (US)

(73) Assignee: Eliyan Corp., Santa Clara, CA (US)

( * ) Notice: Subject to any disclaimer, the term of this patent is extended or adjusted under 35 U.S.C. 154(b) by 0 days.

(21) Appl. No.: 18/493,481

(22) Filed: Oct. 24, 2023

Related U.S. Application Data

(60) Provisional application No. 63/418,713, filed on Oct. 24, 2022.

(51) Int. Cl.
*H03L 7/08* (2006.01)
*H03L 7/081* (2006.01)
*H03L 7/099* (2006.01)

(52) U.S. Cl.
CPC .......... *H03L 7/0998* (2013.01); *H03L 7/0818* (2013.01)

(58) Field of Classification Search
CPC ... H03L 7/0998; H03L 7/0818; H04L 7/0008; H04L 7/033
See application file for complete search history.

(56) References Cited

U.S. PATENT DOCUMENTS 6,031,729 A 2/2000 Berkely
6,222,419 B1 4/2001 Yoshida
6,417,737 B1 7/2002 Moloudi
6,690,742 B2 2/2004 Chan
6,721,313 B1 4/2004 Van Duyne
6,932,618 B1 8/2005 Nelson
7,027,529 B1 4/2006 Ohishi
7,248,890 B1 7/2007 Raghavan
7,269,212 B1 9/2007 Chau
7,477,615 B2 1/2009 Oshita
7,535,958 B2 5/2009 Best
7,701,957 B1 4/2010 Bicknell
7,978,754 B2 7/2011 Yeung (Continued)

OTHER PUBLICATIONS

Ardalan et al, Chiplet Communication Link: Bunch of Wires (BoW), IEEE, Jan. 26, 2021 (Year: 2021).*

(Continued)

*Primary Examiner* — Aristocratis Fotakis
(74) *Attorney, Agent, or Firm* — Lance Kreisman; Peninsula Patent Group

(57) ABSTRACT

An integrated circuit (IC) chip includes a first data receiver including first receiver circuitry to receive first data from a second IC chip. A second data receiver includes second receiver circuitry to receive second data from the second IC chip. Timing circuitry couples to the first receiver and the second receiver in a shared configuration. The timing circuitry generates a receive timing signal to time reception of the first data and the second data by the first and second receivers. The timing circuitry generates the receive timing signal through use of a phase adjustment circuit. The first and second receivers sample the first and second data in response to the receive timing signal. The timing circuitry includes a forwarded timing interface for transferring a forwarded timing signal between the IC chip and the second IC chip.

19 Claims, 3 Drawing Sheets

(56) References Cited

U.S. PATENT DOCUMENTS 8,004,330 B1 8/2011 Acimovic
8,024,142 B1 9/2011 Gagnon
8,121,541 B2 2/2012 Rofougaran
8,483,579 B2 7/2013 Fukuda
8,546,955 B1 10/2013 Wu
8,861,573 B2 10/2014 Chu
8,948,203 B1 2/2015 Nolan
8,982,905 B2 3/2015 Kamble
9,088,334 B2 7/2015 Chakraborty
9,129,935 B1 9/2015 Chandrasekar
9,294,313 B2 3/2016 Prokop
9,349,707 B1 5/2016 Sun
9,379,878 B1 6/2016 Lugthart
9,432,298 B1 8/2016 Smith
9,832,006 B1 11/2017 Bandi
9,886,275 B1 2/2018 Carlson
9,961,812 B2 5/2018 Suorsa
10,171,115 B1 1/2019 Shirinfar
10,410,694 B1 9/2019 Arbel
10,439,661 B1 10/2019 Heydari
10,642,767 B1 5/2020 Farjadrad
10,678,738 B2 6/2020 Dai
10,735,176 B1 8/2020 Heydari
10,855,498 B1 12/2020 Farjadrad
10,935,593 B2 3/2021 Goyal
11,088,876 B1 8/2021 Farjadrad
11,100,028 B1 8/2021 Subramaniam
2002/0122479 A1 9/2002 Agazzi
2002/0136315 A1 9/2002 Chan
2004/0088444 A1 5/2004 Baumer
2004/0113239 A1 6/2004 Prokofiev
2004/0130347 A1 7/2004 Moll
2004/0156461 A1 8/2004 Agazzi
2004/0215856 A1* 10/2004 Leduc ................ G06F 13/4072 710/110
2005/0041683 A1 2/2005 Kizer
2005/0117404 A1 6/2005 Savoj
2005/0134306 A1 6/2005 Stojanovic
2005/0157781 A1 7/2005 Ho
2005/0205983 A1 9/2005 Origasa
2006/0060376 A1 3/2006 Yoon
2006/0103011 A1 5/2006 Andry
2006/0158229 A1 7/2006 Hsu
2006/0181283 A1 8/2006 Wajcer
2006/0188043 A1 8/2006 Zerbe
2006/0250985 A1 11/2006 Baumer
2006/0251194 A1 11/2006 Bublil
2007/0281643 A1 12/2007 Kawai
2008/0063395 A1 3/2008 Royle
2008/0143422 A1 6/2008 Lalithambika
2008/0186987 A1 8/2008 Baumer
2008/0222407 A1 9/2008 Carpenter
2009/0113158 A1 4/2009 Schnell
2009/0154365 A1 6/2009 Diab
2009/0163166 A1* 6/2009 Lin ...................... H03L 7/0998 455/260
2009/0174448 A1 7/2009 Zabinski
2009/0220240 A1 9/2009 Abhari
2009/0225900 A1 9/2009 Yamaguchi
2009/0304054 A1 12/2009 Tonietto
2010/0177841 A1 7/2010 Yoon
2010/0197231 A1 8/2010 Kenington
2010/0294547 A1 11/2010 Hatanaka
2011/0029803 A1 2/2011 Redman-White
2011/0038286 A1 2/2011 Ta
2011/0167297 A1 7/2011 Su
2011/0187430 A1 8/2011 Tang
2011/0204428 A1 8/2011 Erickson
2011/0267073 A1 11/2011 Chengson
2011/0293041 A1 12/2011 Luo
2012/0082194 A1 4/2012 Tam
2012/0182776 A1 7/2012 Best
2012/0192023 A1 7/2012 Lee
2012/0216084 A1 8/2012 Chun
2012/0327818 A1 12/2012 Takatori
2013/0222026 A1 8/2013 Havens
2013/0249290 A1 9/2013 Buonpane
2013/0285584 A1 10/2013 Kim
2013/0318266 A1* 11/2013 Thomas ................. G06F 13/40 710/106
2014/0016524 A1 1/2014 Choi
2014/0048947 A1 2/2014 Lee
2014/0126613 A1 5/2014 Zhang
2014/0192583 A1 7/2014 Rajan
2014/0269860 A1 9/2014 Brown
2014/0269983 A1 9/2014 Baeckler
2015/0012677 A1 1/2015 Nagarajan
2015/0172040 A1 6/2015 Pelekhaty
2015/0180760 A1 6/2015 Rickard
2015/0206867 A1 7/2015 Lim
2015/0271074 A1 9/2015 Hirth
2015/0288510 A1* 10/2015 Chen ..................... H04L 7/0008 370/294
2015/0326348 A1 11/2015 Shen
2015/0358005 A1 12/2015 Chen
2016/0056125 A1 2/2016 Pan
2016/0071818 A1 3/2016 Wang
2016/0111406 A1 4/2016 Mak
2016/0217872 A1 7/2016 Hossain
2016/0294585 A1 10/2016 Rahman
2017/0033918 A1 2/2017 Hossain et al.
2017/0317859 A1 11/2017 Hormati
2017/0331651 A1 11/2017 Suzuki
2017/0346617 A1* 11/2017 Bandi ..................... H04L 25/14
2018/0010329 A1 1/2018 Golding, Jr.
2018/0082981 A1 3/2018 Gowda
2018/0175001 A1 6/2018 Pyo
2018/0190635 A1 7/2018 Choi
2018/0315735 A1 11/2018 Delacruz
2019/0044764 A1 2/2019 Hollis
2019/0058457 A1 2/2019 Ran
2019/0108111 A1 4/2019 Levin
2019/0198489 A1 6/2019 Kim
2020/0373286 A1 11/2020 Dennis
2021/0082875 A1 3/2021 Nelson
2021/0117102 A1 4/2021 Grenier
2021/0181974 A1 6/2021 Ghosh
2021/0183842 A1 6/2021 Fay
2021/0258078 A1 8/2021 Meade
2022/0038095 A1* 2/2022 Hafizi ..................... G05F 1/575
2022/0159860 A1 5/2022 Winzer
2022/0223522 A1 7/2022 Scearce
2022/0231676 A1* 7/2022 Kalyanamahadevi Gopalan Jawarlal .................. H03L 7/081
2023/0039033 A1 2/2023 Zarkovsky
2023/0085155 A1* 3/2023 Malone ..................... G06F 1/12 713/401
2023/0090061 A1 3/2023 Zarkovsky
2023/0195678 A1* 6/2023 Jayaraman .......... G06F 13/4291 710/110
2023/0236999 A1* 7/2023 Azadet .................... G06F 13/36 710/305

OTHER PUBLICATIONS

Zhang et al, "A CNRZ-7 Based Wireline Transceiver With High-Bandwidth-Density, Low-Power for D2D Communication", China, DOI: 10.1109/ACCESS.2022.3204744, IEEE Access, Sep. 19, 2022 (Year: 2022).*

Debendra Das Sharma , Gerald Pasdast, Zhiguo Qian and Kemal Aygün, Universal Chiplet Interconnect Express (UCIe): An Open Industry Standard for Innovations With Chiplets at Package Level, IEEE Transactions on Components, Packaging and Manufacturing Technology, vol. 12, No. 9, Sep. 2022 (Year: 2022).*

Geng Zhang, Mingche Lai, and Fangxu Lyu, "A Multichannel, High-Bandwidth Wirelane Receiver for D2D Interconnects", Electronics 2022, 11,2864, MDPI, Sep. 10, 2022 (Year: 2022).*

Universal Chiplet Interconnect Express (UCIe) Specification, Rev 1.0, Feb. 2022 (Year: 2022).*

Vivet et al , INTACT: A 96-Core Processor With Six Chiplets 3D-Stacked on an Active Interposer With Distributed Interconnects

(56) References Cited

OTHER PUBLICATIONS and Integrated Power Management, IEEE Journal of Solid-State Circuits, vol. 56, No. 1, Jan. 2021 (Year: 2021).*
U.S. Appl. No. 16/812,234; Mohsen F. Rad; filed Mar. 6, 2020.
Farjadrad et al., "A Bunch of Wires (BOW) Interface for Inter-Chiplet Communication", 2019 IEEE Symposium on High-Performance Interconnects (HOTI), pp. 27-30, Oct. 2019.
Universal Chiplet Interconnect Express (UCIe) Specification Rev. 1.0, Feb. 24, 2022.
NVLink-C2C: A Coherent Off Package Chip-to-Chip Interconnect with 40Gbps/pin Single-ended Signaling; Ying Wei, et al.; International Solid-State Circuits Conference, 2023.
"NVLink-C2C: A Coherent Off Package Chip-to-Chip Interconnect with 40Gbps/pin Singel-ended Signaling"; Ying Wei, et al.; 2023 IEEE International Solid-State Circuits Conference.

* cited by examiner

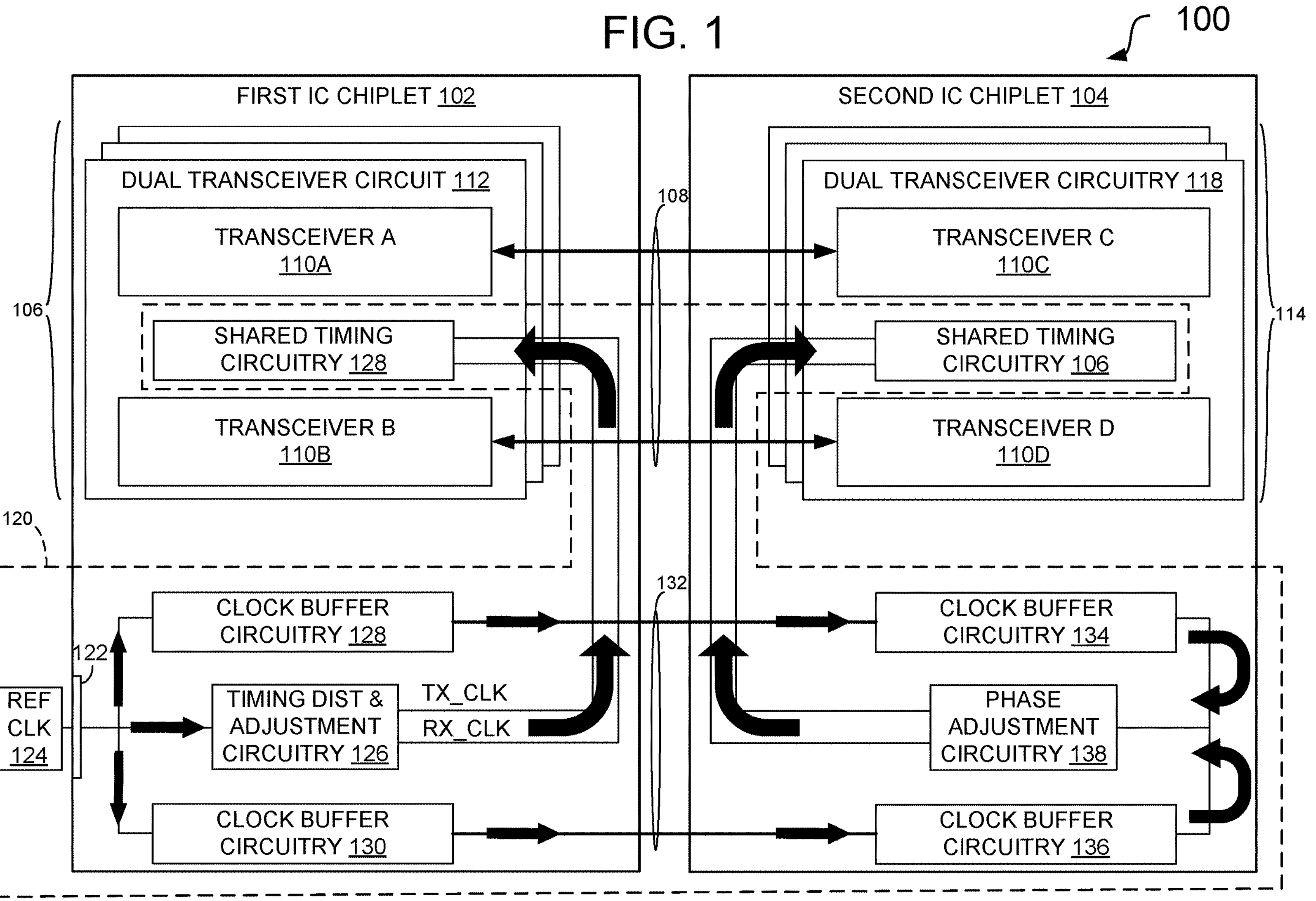
FIG. 1
100
FIRST IC CHIPLET 102
DUAL TRANSCEIVER CIRCUIT 112
TRANSCEIVER A 110A
SHARED TIMING CIRCUITRY 128
TRANSCEIVER B 110B
106
108
SECOND IC CHIPLET 104
DUAL TRANSCEIVER CIRCUITRY 118
TRANSCEIVER C 110C
SHARED TIMING CIRCUITRY 106
TRANSCEIVER D 110D
114
120
132
CLOCK BUFFER CIRCUITRY 128
122
REF CLK 124
TIMING DIST & ADJUSTMENT CIRCUITRY 126
TX_CLK
RX_CLK
CLOCK BUFFER CIRCUITRY 130
CLOCK BUFFER CIRCUITRY 134
PHASE ADJUSTMENT CIRCUITRY 138
CLOCK BUFFER CIRCUITRY 136

FIG. 2

EFFICIENT CLOCKING SCHEME FOR DIE-TO-DIE CONNECTIVITY

CROSS-REFERENCE TO RELATED APPLICATIONS

This application is a Non-Provisional that claims priority to U.S. Provisional Application No. 63/418,713, filed Oct. 24, 2022, entitled EFFICIENT CLOCKING SCHEME FOR DIE-TO-DIE CONNECTIVITY, which is incorporated herein by reference in its entirety.

TECHNICAL FIELD

The disclosure herein relates to semiconductor devices, packaging and associated methods.

BACKGROUND

As integrated circuit (IC) chips such as system on chips (SoCs) become larger, the yields realized in manufacturing the chips become smaller. Decreasing yields for larger chips increases overall costs for chip manufacturers. To address the yield problem and also reduce costs, chiplet architectures have been proposed that favor a modular approach to SoCs. The solution employs smaller sub-processing chips, each containing a well-defined subset of functionality. Chiplets thus allow for dividing a complex design, such as a high-end processor or networking chip, into several small interconnected die instead of one large monolithic die.

Employing multiple interconnected die within a single package presents a host of challenges, including maintaining the synchronization of various signals across different clocking domains while minimizing power consumption. Existing solutions to these problems leave room for improvement in various areas.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 1 illustrates a high-level embodiment of a multi-chip module (MCM), including a master integrated circuit (IC) chiplet in communication with a minion IC chiplet.

FIG. 2 illustrates further detail for one embodiment of the master IC chiplet in the MCM of FIG. 1.

DETAILED DESCRIPTION

Figure 3:
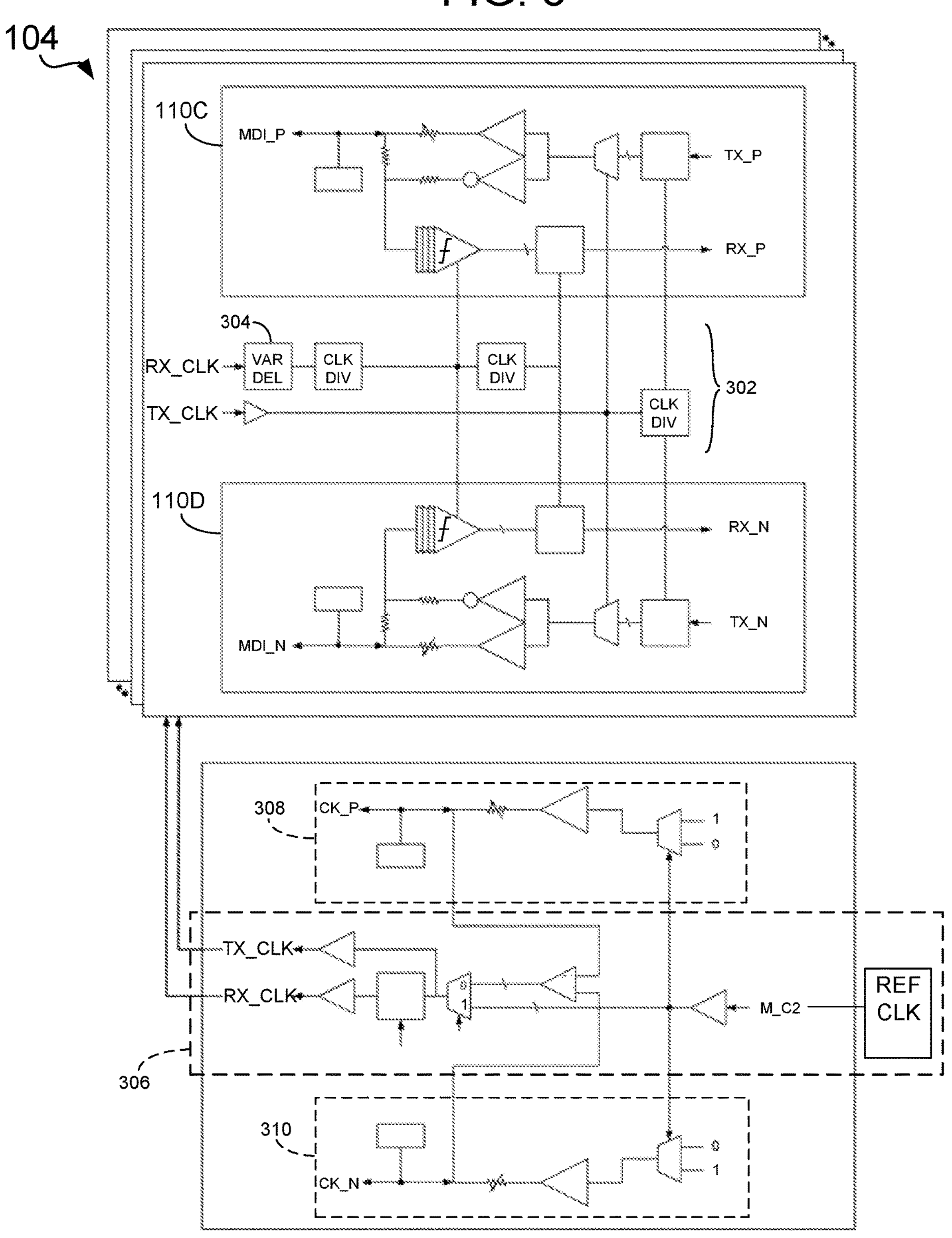
FIG. 3 illustrates further detail for one embodiment of the minion IC chiplet in the MCM of FIG. 1.

Semiconductor devices, packaging architectures and associated methods are disclosed. An integrated circuit (IC) chip includes a first data receiver including first receiver circuitry to receive first data from a second IC chip. A second data receiver includes second receiver circuitry to receive second data from the second IC chip. Timing circuitry couples to the first receiver and the second receiver in a shared configuration. The timing circuitry generates a receive timing signal to time reception of the first data and the second data by the first and second receivers. The timing circuitry generates the receive timing signal through use of a phase adjustment circuit. The first and second receivers sample the first and second data in response to the receive timing signal. The timing circuitry includes a forwarded timing interface for transferring a forwarded timing signal between the IC chip and the second IC chip. By employing the timing circuitry in a shared configuration with the first receiver and the second receiver, a reduction in power consumption may be achieved for phase adjustment operations.

Throughout the disclosure provided herein, the term multi-chip module (MCM) is used to represent a semiconductor device that incorporates multiple semiconductor die or sub-packages in a single unitary package. An MCM may also be referred to as a system in a package (SiP). With reference to FIG. 1, a block diagram of one embodiment of a multi-chip module (MCM) is shown, generally designated 100. For one embodiment, the MCM 100 includes a package substrate (not shown) that forms a support surface for multiple integrated circuit (IC) chips, or chiplets, including a first IC chiplet 102 and a second IC chiplet 104. For some applications, the package substrate takes the form of a low-cost non-silicon substrate.

With continued reference to FIG. 1, for one embodiment the first IC chiplet 102 includes transceiver circuitry 106 for transmitting and receiving signals to and from the second IC chiplet 104 via multiple signaling paths or lanes 108. For one embodiment, pairs of transceivers 110A and 110B are configured as a dual transceiver circuit 112 for transferring signals across corresponding dual lanes of the multiple lanes 108. The second IC chiplet 104 includes transceiver circuitry 114 that is similar to the transceiver circuitry 106 of the first IC chiplet 102, with pairs of transceivers 110C and 11D being configured as a dual transceiver circuit 118 for transferring signals across corresponding dual lanes of the multiple lanes 108.

Further referring to FIG. 1, to synchronize the transmission and receipt of data to and from the multiple lanes 108 by the respective dual transceiver circuits 112 and 118 of the first and second IC chiplets 102 and 104, the MCM 100 employs a source-synchronous or forwarded timing architecture 120.

With continued reference to FIG. 1, for one embodiment, the forwarded timing architecture 120 is apportioned between the first IC chiplet 102 and the second IC chiplet 104 in a manner that is based on a master-minion scheme. Thus, for one embodiment, one of the IC chiplets serves as a master IC chiplet that generates on-chip timing signals and forwards versions of the timing signals to the other IC chiplet, while the other of the chiplets serves as a minion IC chiplet to receive the forwarded timing signals and generate on-chip timing signals based on the forwarded timing signals. For some embodiments, configurable circuitry described more fully below allows either of the first or second IC chiplets 102 or 104 to be configured as a master or minion IC chiplet for purposes of timing synchronization.

Further referring to FIG. 1, and with the first IC chiplet 102 being configured as a master IC chiplet, a first portion of the forwarded timing architecture 120 is disposed on the master IC chiplet 102 and includes a reference clock interface 122 that couples to a reference clock source 124. The reference clock source 124 provides a reference clock signal that is distributed throughout the master IC chiplet 102, and forwarded to the minion IC chiplet 104. For some embodiments, the reference clock source 124 resides off-chip, while in other embodiments the reference clock source 124 may reside on-chip.

With continued reference to FIG. 1, to distribute versions of the reference clock signal as distributed clock signals on-chip, and to provide coarse phase adjustments to selected ones of the distributed clock signals, the master IC chiplet 102 includes first timing distribution and adjustment circuitry 126. Generally, the timing distribution and adjustment circuitry 126 creates a transmit clock signal TX_CLK and a receive clock signal RX_CLK that are fed as clock inputs to each copy of the dual transceiver circuit 112. In addition, the receive clock signal RX_CLK is phase adjusted with respect to the transmit clock signal TX_CLK, for each copy of the dual transceiver circuit 112, by a coarse phase adjustment that is based on data and edge samples associated with data received from the minion IC chiplet 104. For one embodiment, the coarse phase adjustment that is determined is provided as a common coarse phase adjustment for all of the lanes 108. As a result, power consumption associated with the timing distribution and adjustment circuitry 126 is amortized across all of the lanes 108, resulting in a more efficient power profile for the master IC chiplet 102. For some embodiments, instead of phase-adjusting the receive clock signal RX_CLK with the coarse phase adjustments, the transmit clock signal TX_CLK may be phase-adjusted by the timing distribution and adjustment circuitry 126.

Figure 2:
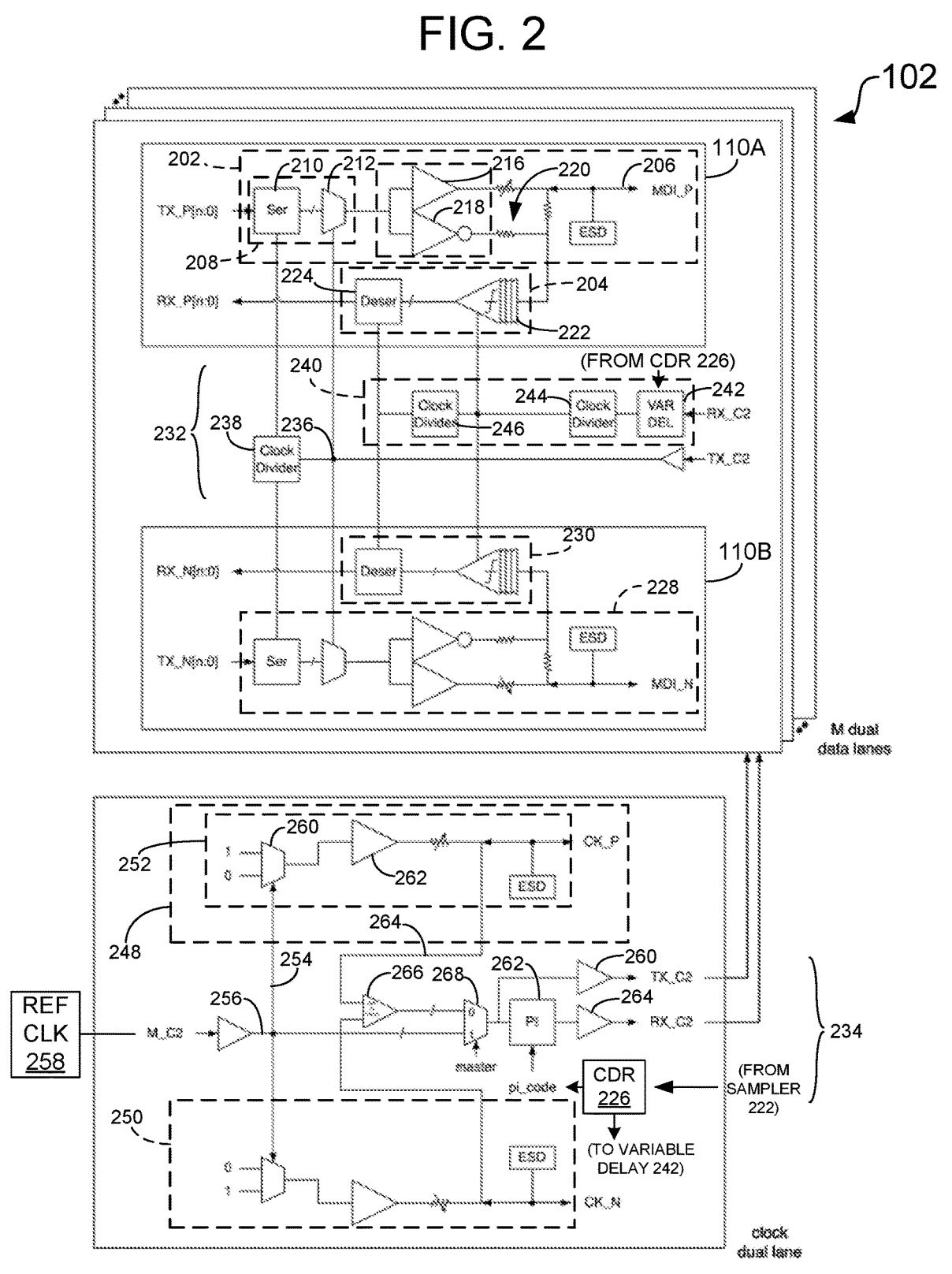

Further referring to FIG. 1, shared timing circuitry 128 resident in each dual transceiver circuit 112 receives the transmit and receive clock signals TX_CLK and RX_CLK and performs fine adjustments to the receive clock signal RX_CLK based on data and edge samples associated with data received from the minion IC chiplet 104 via the pair of lanes associated with the dual transceiver circuit 112. The shared timing circuitry 128 provides the transmit clock signal TX_CLK and a phase-adjusted version of the receive clock signal RX_CLK to both transceivers 110A and 11B of the dual transceiver circuit 112 in a shared manner, similar to the timing distribution and adjustment circuitry 126. This also increases the power efficiency of the forwarded clock architecture 120. Further detail pertaining to the timing distribution and adjustment circuitry 126 and the shared timing circuitry 128 is shown in FIG. 2 and described more fully below.

Further referring to FIG. 1, as noted above, the reference clock source 124 provides a reference clock signal that is not only distributed on-chip, but also forwarded to the minion IC chiplet 104. For one embodiment, the clock forwarding is carried out by respective first and second clock buffer circuits 128 and 130 which transmit respective copies of the reference clock signal along a dual clock lane 132. For one embodiment, the respective copies of the clock signal along the dual clock lane 132 cooperate to form a pseudo-differential clock signal. The minion IC chiplet 104 includes third and fourth clock buffer circuits 134 and 136 that are similar to the first and second clock buffer circuits 128 and 130 of the master IC chiplet 102. However, instead of receiving the reference clock signal at their clock inputs, the third and fourth clock buffer circuits 134 and 136 receive the forwarded clock signals, and feed the forwarded clock signals into a second timing distribution and adjustment circuit 138.

With continued reference to FIG. 1, for one embodiment the second timing distribution and adjustment circuit 138 carries out similar functions as those performed by the first timing distribution and adjustment circuit 126, such as distributing the forwarded clock signals on-chip, and providing coarse phase adjustments to selected ones of the distributed clock signals in a power-efficient manner. The distributed transmit and receive clocks TX_CLK and RX_CLK are fed to second shared timing circuitry 140 that operates similar to the first shared timing circuitry 128 that resides on the master IC chiplet 102.

In general, operation of the forwarded timing architecture 120 involves having the minion IC chiplet 104 time its transceivers 110C and 110D based on timing signals that are derived from the timing signals used and forwarded by the master IC chiplet 102. As data transmitted by the minion IC chiplet 104 is received by the master IC chiplet 102 (without an accompanying timing signal), the timing information associated with and embedded in the data, and extractable by taking edge and/or data samples, may be evaluated by a form of timing recovery circuit, such as a clock and data recovery (CDR) circuit to provide the basis for correcting any clock and data phase misalignments via appropriate phase adjustments to the receive clock signals.

FIG. 2 illustrates further detail for one embodiment of the first IC chiplet 102 of FIG. 1, including more detailed aspects of the dual transceiver circuit 112, and the forwarded timing circuitry 120. For one embodiment, each transceiver 110A and 110B of each dual transceiver circuit 112 includes a transmit path 202 and a receive path 204 that couple to a connection interface, such as at 206, for coupling to a single serial link or lane of the multiple lanes 108 (FIG. 1). For one embodiment, the transceiver architecture for each of the transceivers 110A and 110B is configured to carry out simultaneous bidirectional data transfers, where the transmit path 202 transmits first data to the second IC chiplet 104 during at least a portion of a same timing interval that the receive path 204 receives second data from the second IC chiplet 104. The transmit path 202 includes a serializer circuit 208 with a first stage 210 that loads first transmit data TX_P in a parallel format in response to a divided transmit clock signal, and a serialization stage 212 that transforms the parallel first transmit data into serialized first data which is transmitted to a transmit driver circuit 214 in response to an undivided common transmit clock signal TX_C2. The transmit driver circuit 214 includes a main driver 216 that transmits the serialized first data to the second IC chiplet 104 via the first serial lane connection interface 206. A replica driver 218 transmits an inverted copy of the serialized first data to a hybrid network circuit 220 for summing with received second data from the second IC chiplet 104 to cancel out a copy of the first transmit data that is received and summed with the received second data.

Further referring to FIG. 2, for one embodiment, the receive path 204 of the first transceiver 110A includes a receiver circuit 222 that, for one embodiment, includes data sampler circuitry to sample the received serialized second data at a midpoint of a data eye in response to a first sampling clock signal, and edge sampler circuitry to generate edge samples at one or both edges of the data eye, in response to one or more quadrature clock signals that are offset in phase by a quadrature relationship from the first sampling clock signal. The sampled serialized second data is then fed to a deserializer 224, which converts the serialized data into parallel data for the first IC chiplet 102 in response to a divided version of the common receive clock signal RX_C2. A copy of the data and edge samples are also provided to a clock and data recovery (CDR) circuit 226 for a timing analysis process, described more fully below.

With continued reference to FIG. 2, for one embodiment, the second transceiver 110B of the first IC chiplet 102 is formed similar to the first transceiver 110A, with similar transmit path circuitry 228 that is responsive to the common transmit clock TX_C2 and receive path circuitry 230 that is responsive to the common receive clock signal RX_C2. Shared timing circuitry 232, which corresponds to the shared timing circuitry 128 of FIG. 1, provides the shared transmit and receive clock signals and includes a transmit clock path that receives the transmit clock signal TX_C2 from on-chip timing distribution and adjustment circuitry 234. The transmit clock path includes a node, at 236, which feeds the transmit clock signal TX_C2 to the transmit serialization circuitry 212 of each of the transceivers 110A and 110B. A transmit clock divider 238 divides-down the transmit clock frequency for application to the loading circuits 210 that load the parallel transmit data just prior to serialization by the serializer 212. The shared transmit timing signal TX_C2 ensures that differential data bits are delay-matched as they travel from the transmit circuit inputs TX_P and TX_N, to the transmit path outputs MDI_P and MDI_N.

Further referring to FIG. 2, the shared timing circuitry 232 includes a receive clock path 240 from the on-chip timing distribution and adjustment circuitry 234. The receive clock path 240 includes a variable delay circuit 242 that receives the receive clock signal RX_C2 from the on-chip timing distribution and adjustment circuitry 234, and applies a fine phase adjustment to the receive clock signal RX_C2 based on data and edge samples of received data from at least one of the serial lanes 108. For one embodiment, data and edge samples are taken from data on adjacent lanes to determine a difference between a timing phase associated with the received data, and the phases of the data and edge sampling clocks to arrive at an averaged phase adjustment that is used across the multiple lanes 108 to correct a majority of the phase difference. The phase-delayed clock signal is fed from the variable delay circuit 242 to a first clock divider circuit 244 to generate the sampling clocks for the edge and data sampling circuitry 222. One of the sampling clocks feeds a second clock divider circuit 246 to generate a common clock signal for the deserializer circuit 224 (and its counterpart in the transceiver 110B). The shared receive timing signals ensure that differential data bits are delay-matched as they progress from the receive circuit inputs MDI_P and MDI_N, to the receive path outputs RX_P and RX_N.

With continued reference to FIG. 2, the common transmit and receive clocks TX_C2 and RX_C2 are generated by respective clock buffer circuits 248 and 250, that cooperate with the on-chip timing distribution and adjustment circuitry 234. The clock buffer circuits 248 and 250 and the on-chip timing distribution and adjustment circuitry 234 generally correspond to the clock buffer circuits 128 and 130 and the on-chip timing distribution and adjustment circuitry 126 of FIG. 1, but are here shown with additional detail, including configuration circuitry that allows the clock buffer circuits 128 and 130 and the on-chip timing distribution and adjustment circuitry 126 to be configured for use with a master IC chiplet or a minion IC chiplet.

Further referring to FIG. 2, each of the clock buffer circuits 248 and 250 are configurable for operating in support of a master IC chiplet or a minion IC chiplet. To achieve this configurability and referring now to one of the clock buffer circuits 248, in a master mode of operation the clock buffer circuit 248 enables a transmit clock path 252 that includes a control path 254 that taps a clock line 256 from a reference clock source 258 that provides a reference clock signal M_C2. The control path 254 provides a copy of the tapped clock signal M_C2 to the control input of a multiplexer 260 to alternatingly generate a copy of the clock signal M_C2 as a forwarded clock for transmission by a clock driver 262 along a first clock lane CK_P to the minion IC chiplet. In a minion mode of operation, the clock buffer circuit 248 enables a receive clock path 264 that couples to the first clock lane CK_P to receive the forwarded clock from the master IC chiplet. The forwarded clock is passed to a receiver circuit 266 which converts the forwarded clock to full-swing voltages. For one embodiment, while operating in the minion mode of operation, the transmit clock driver 262 is enabled only to provide a termination. For some embodiments, the transmit paths for each clock driver are configured as replicas of the transceiver transmit circuitry.

With continued reference to FIG. 2, the on-chip timing distribution and adjustment circuitry 234 includes a mode selector 268 that responds to a control input to allow either clock signals generated by the reference clock source 258 to be distributed on chip to the transceivers 110A and 110B, in the master mode of operation, or allow forwarded clocks received over the dual clock lanes to be distributed on-chip to the transceivers 110A and 110B in the minion mode of operation. The selected clock signal is then fed to a first clock driver 260 as the transmit clock TX_C2, and also along a receive clock path which includes a phase adjustment circuit 262, followed by a second clock driver 264.

Further referring to FIG. 2, for one embodiment, the phase adjustment circuit 262 takes the form of a phase interpolator, and is able to make adjustments to the phase and frequency of the receive clock signal based on a control code generated by the CDR circuit 226. For one embodiment the phase interpolator 262 generates a coarse phase adjustment that corrects for clock skew caused by a round-trip delay incurred by the forwarded clock signal as it is transferred from the first IC chiplet 102 to the second IC chiplet 104, and then returned as timing information associated with receive data sent by the second IC chiplet 104 to the first IC chiplet 102. Moreover, in embodiments, the phase interpolator circuit 262 is shared by multiple lanes to improve the power efficiency exhibited by the first IC chiplet 102.

FIG. 3 illustrates one embodiment of the second IC chiplet 104 of FIG. 1, including more detailed aspects of the dual transceiver circuit 118, and the portion of the forwarded timing circuitry 120 that resides on the second IC chiplet 104. For one embodiment, each transceiver 110C and 110D of each dual transceiver circuit 118 is formed similar to the transceivers 110A and 110B, and for one embodiment, are configured to carry out simultaneous bidirectional data transfers with transceivers 110A and 110B. Timing circuitry 302 is provided on the second IC chiplet 104 for sharing between the transceivers 110C and 110D of the dual transceiver circuit 118. For one embodiment, the shared timing circuitry 302 is configured similar to the shared timing circuitry 232 of FIG. 2, including a variable delay circuit 304 that receives a version of the receive clock signal RX_C2 from on-chip timing distribution and adjustment circuitry 306, and applies a fine phase adjustment to the receive clock signal RX_C2 based on data and edge samples of received data from at least one of the serial lanes 108.

Similar to the first IC chiplet 102, the second IC chiplet 104 generates the common transmit and receive clocks TX_C2 and RX_C2 by respective clock buffer circuits 308 and 310, that cooperate with the on-chip timing distribution and adjustment circuitry 306. The clock buffer circuits 308 and 310 and the on-chip timing distribution and adjustment circuitry 306 generally correspond to the clock buffer circuits 134 and 136 and the on-chip timing distribution and adjustment circuitry 138 of FIG. 1, and are configurable for operating in support of a master IC chiplet or a minion IC chiplet in much the same manner and using similar circuitry as that shown in FIG. 2.

While the shared timing circuitry of FIGS. 1-3 is shown and described as being shared between two lanes, to achieve a higher level of power efficiency, the variable delay circuitry may be shared by any number of lanes to accomplish a common fine phase adjustment for the number of lanes.

Those skilled in the art will appreciate that the various embodiments disclosed herein may be utilized separately or in various sub-combinations to improve the power efficiency of one or more integrated circuit (IC) chips. Sharing timing adjustment circuitry in various fashions between multiple data lanes advantageously results in lower costs and improved power and performance characteristics.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{signalname}$') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. An integrated circuit (IC) chiplet, comprising:

a first number of multiple data receivers, each of the multiple data receivers comprising a clock input to receive a common clock signal;

wherein the first number of multiple data receivers are organized into subsets of data receivers, each subset of the subsets of data receivers comprising:

a second number of data receivers that is less than the first number of multiple data receivers, the second number of data receivers to receive data signals at substantially a same time; and phase adjustment circuitry that is shared solely by the second number of data receivers, the phase adjustment circuitry to generate a sampling clock signal by adjusting a timing of the common clock signal to sample data signals of the subsets of data receivers.

2. The IC chiplet of claim 1, wherein:

the adjusting of the timing of the common clock signal is based on the timing of a data signal received by at least one of the second number of data receivers.

3. The IC chiplet of claim 1, wherein:

the common clock signal is generated by a common clock phase adjustment circuit and forwarded from a second IC chiplet.

4. The IC chiplet of claim 3, wherein:

the common clock phase adjustment circuit comprises a phase interpolator that adjusts the timing of the common clock signal by coarse phase increments of a first phase granularity.

5. The IC chiplet of claim 4, wherein:

the phase adjustment circuitry comprises a variable delay circuit that adjusts the timing of the common clock signal by fine phase increments of a second phase granularity that is finer than the first phase granularity.

6. The IC chiplet of claim 1, wherein:

the adjusting of the timing of the common clock signal based on the timing of a data signal received by at least one data receiver before being distributed to the subsets of the data receivers.

7. The IC chiplet of claim 1, wherein:

each subset of the subsets of data receivers comprises a pair of adjacent data receivers.

8. A chiplet-based system-in-package (SiP), comprising:

a first integrated circuit (IC) chiplet comprising a first number of multiple transmitters to transmit multiple data signals;

a second IC chiplet coupled to the first IC chiplet via multiple data lanes, the second IC chiplet comprising multiple data receivers coupled to the first number of multiple transmitters via the multiple data lanes, each of the multiple data receivers comprising a clock input to receive a common clock signal;

wherein multiple data receivers are organized into subsets of data receivers, each subset of the subsets of data receivers comprising:

a second number of data receivers that is less than the multiple data receivers, the second number of data receivers to receive data signals at substantially a same time; and phase adjustment circuitry that is shared solely by the second number of data receivers, the phase adjustment circuitry to generate a sampling clock signal by adjusting a timing of the common clock signal to sample data signals of the subsets of data receivers.

9. The chiplet-based SiP of claim 8, wherein:

the adjusting of the timing of the common clock signal is based on the timing of a data signal received by at least one data receiver.

10. The chiplet-based SiP of claim 8, wherein:

the first IC chiplet comprises a common clock phase adjustment circuit to generate the common clock signal and to forward the common clock signal to the second IC chiplet.

11. The chiplet-based SiP of claim 10, wherein:

the common clock phase adjustment circuit comprises a phase interpolator to adjust the timing of the common clock signal by coarse phase increments of a first phase granularity.

12. The chiplet-based SiP of claim 11, wherein:

the phase adjustment circuitry comprises a variable delay circuit that adjusts the timing of the common clock signal by fine phase increments of a second phase granularity that is finer than the first phase granularity.

13. The chiplet-based SiP of claim 8, wherein:

the adjusting of the timing of the common clock signal is based on the timing of a data signal received by at least one of the second number of data receivers before being distributed to the subsets of the data receivers.

14. The chiplet-based SiP of claim 8, wherein:

each subset of the subsets of data receivers comprises a pair of adjacent data receivers.

15. A method of operation in an integrated circuit (IC) chiplet, comprising:

receiving a common clock signal by a first number of multiple data receivers;

receiving data signals at substantially a same time with adjacent data receivers that form a subset of the first number of multiple data receivers, the subset of the first number of multiple data receivers comprising a second number of data receivers that is less than the first number of multiple data receivers;

coupling phase adjustment circuitry that is shared solely by the subset of the first number of multiple data receivers;

generating, with the phase adjustment circuitry, a sampling clock signal by adjusting a timing of the common clock signal to sample data signals of the adjacent data receivers.

16. The method of claim 15, wherein:

the adjusting of the timing of the common clock signal is based on the timing of a data signal received by at least one data receiver before being distributed to the subset of the first number of multiple data receivers.

17. The method of claim 15, wherein:

the receiving of the common clock signal comprises receiving a forwarded clock signal that is generated by a common clock phase adjustment circuit and forwarded from a second IC chiplet.

18. The method of claim 17, wherein:

the adjusting of the timing of the common clock signal comprises adjusting, with a phase interpolator of the common clock phase adjustment circuit, the timing of the common clock signal by coarse phase increments of a first phase granularity.

19. The method of claim 18, wherein:

the adjusting of the timing of the common clock signal further comprises adjusting, with a variable delay circuit of the phase adjustment circuitry, the timing of the common clock signal by fine phase increments of a second phase granularity that are finer than the first phase granularity.

* * * * *